(12) United States Patent
Tatsumi et al.

(10) Patent No.: US 11,094,664 B2
(45) Date of Patent: *Aug. 17, 2021

(54) SEMICONDUCTOR DEVICE AND METHOD OF MANUFACTURING SEMICONDUCTOR DEVICE

(71) Applicant: MITSUBISHI ELECTRIC CORPORATION, Tokyo (JP)

(72) Inventors: Hiroaki Tatsumi, Tokyo (JP); Sho Kumada, Tokyo (JP); Osamu Suzuki, Tokyo (JP); Daisuke Kawabata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 16/746,042

(22) Filed: Jan. 17, 2020

(65) Prior Publication Data

US 2020/0194399 A1 Jun. 18, 2020

Related U.S. Application Data

(62) Division of application No. 15/740,873, filed as application No. PCT/JP2016/069099 on Jun. 28, 2016, now Pat. No. 10,573,617.

(30) Foreign Application Priority Data

Jul. 1, 2015 (JP) ................................. 2015-132894

(51) Int. Cl.
*H01L 21/50* (2006.01)
*H01L 23/00* (2006.01)
(Continued)

(52) U.S. Cl.
CPC .............. *H01L 24/32* (2013.01); *H01L 21/50* (2013.01); *H01L 23/12* (2013.01);
(Continued)

(58) Field of Classification Search
CPC .......... H01L 21/50; H01L 21/52; H01L 24/32
See application file for complete search history.

(56) References Cited

U.S. PATENT DOCUMENTS 10,573,617 B2 * 2/2020 Tatsumi ................ H01L 23/488

FOREIGN PATENT DOCUMENTS

JP    S57-035359 A    2/1982
JP    2000-256081 A   9/2000
(Continued)

OTHER PUBLICATIONS

International Preliminary Report on Patentability and Written Opinion of the International Searching Authority (Forms PCT/IB326, PCT/IB/373 and PCT/ISA/237) dated Jan. 11, 2018, by the International Bureau of WIPO, in corresponding International Application No. PCT/JP2016/069099, with English Translation. (12 pages).
(Continued)

*Primary Examiner* — Douglas M Menz
(74) *Attorney, Agent, or Firm* — Buchanan Ingersoll & Rooney PC

(57) ABSTRACT

A semiconductor device includes an electrode having a flat part and a non-flat part made up of a concave part, a joint layer being made of a sintered body of metal crystal grains provided on the flat part and the non-flat part of the electrode, and a semiconductor element being joined to the electrode with the joint layer therebetween, wherein the joint layer has a first region sandwiched between the non-flat part and the semiconductor element and a second region sandwiched between the flat part and the semiconductor element, and either one of the first region and the second region
(Continued)

having a larger film thickness has a filling rate of the metal crystal grains smaller than the other one of the first region and the second region having a smaller film thickness. The present invention enhances reliability of a joint layer made of a sintered body of metal crystal grains.

12 Claims, 11 Drawing Sheets

(51) Int. Cl.
| | |
|---|---|
| H01L 23/488 | (2006.01) |
| H01L 23/373 | (2006.01) |
| H01L 23/12 | (2006.01) |
| H01L 23/498 | (2006.01) |
| H01L 25/07 | (2006.01) |
| H01L 29/16 | (2006.01) |
| H01L 29/20 | (2006.01) |
| H01L 29/739 | (2006.01) |
| H01L 29/78 | (2006.01) |
| H01L 29/861 | (2006.01) |

(52) U.S. Cl.
CPC ........ *H01L 23/3735* (2013.01); *H01L 23/488* (2013.01); *H01L 23/49866* (2013.01); *H01L 24/83* (2013.01); *H01L 25/072* (2013.01); *H01L 29/1602* (2013.01); *H01L 29/1608* (2013.01); *H01L 29/20* (2013.01); *H01L 29/2003* (2013.01); *H01L 29/7393* (2013.01); *H01L 29/78* (2013.01); *H01L 29/861* (2013.01); *H01L 2224/29139* (2013.01); *H01L 2224/3207* (2013.01); *H01L 2224/83385* (2013.01)

(56) References Cited

FOREIGN PATENT DOCUMENTS

| JP | 2001-085571 A | 3/2001 |
| JP | 2006-202586 A | 8/2006 |
| JP | 2007-214340 A | 8/2007 |
| JP | 2012-124497 A | 6/2012 |
| JP | 2015-106677 A | 6/2015 |

OTHER PUBLICATIONS

International Search Report (PCT/ISA/210) dated Sep. 27, 2016, by the Japanese Patent Office as the International Searching Authority for International Application No. PCT/JP2016/069099.
Written Opinion (PCT/ISA/237) dated Sep. 27, 2016, by the Japanese Patent Office as the International Searching Authority for International Application No. PCT/JP2016/069099.
Office Action (Notification of Reasons for Refusal) dated Jul. 24, 2018, by the Japanese Patent Office in corresponding Japanese Patent Application No. 2017-526360 and English translation of the Office Action. (6 pages).
Office Action dated Jul. 2, 2019 by the State Intellectual Property Office of People's Republic of China in corresponding Chinese Patent Application No. 201680026428.0 and an English translation of the Office Action. (16 pages).
Office Action (Notice of Reasons for Refusal) dated Aug. 27, 2019, by the Japanese Patent Office in corresponding Japanese Patent Application No. 2018-203877 and English translation of the Office Action. (14 pages).

* cited by examiner

F I G. 5
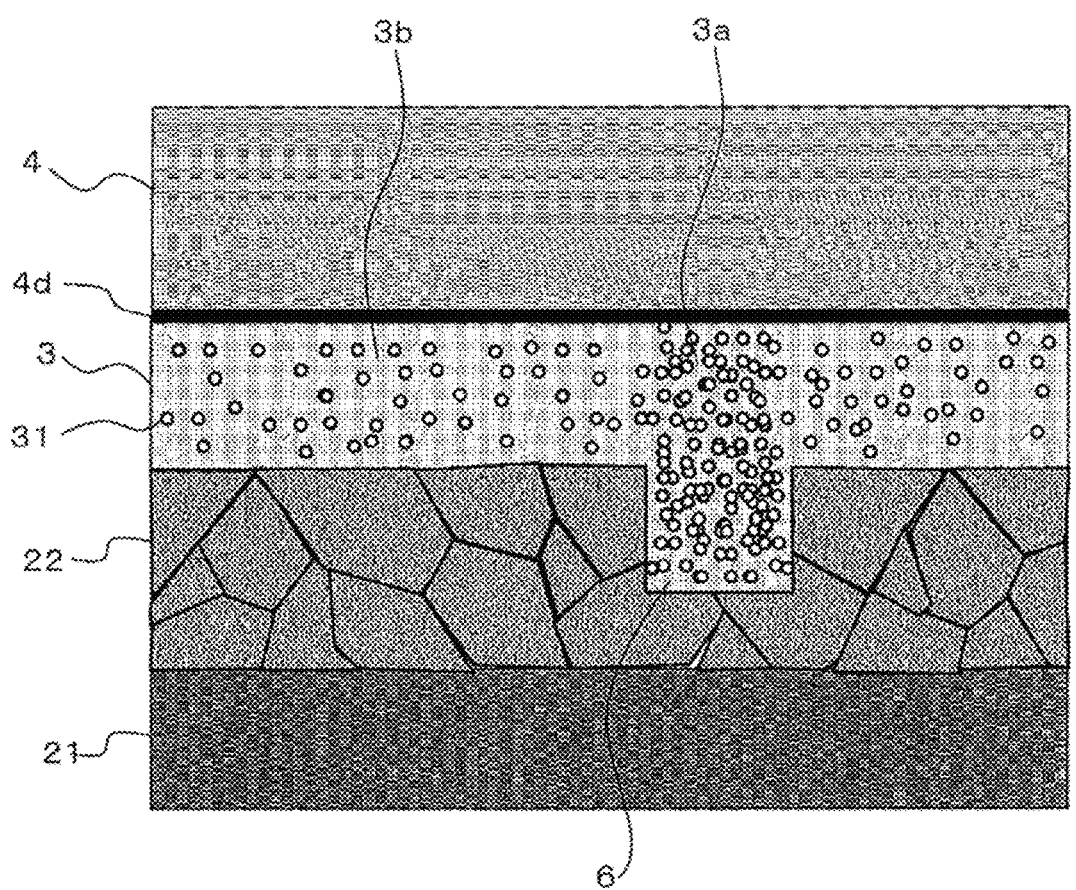

F I G. 13
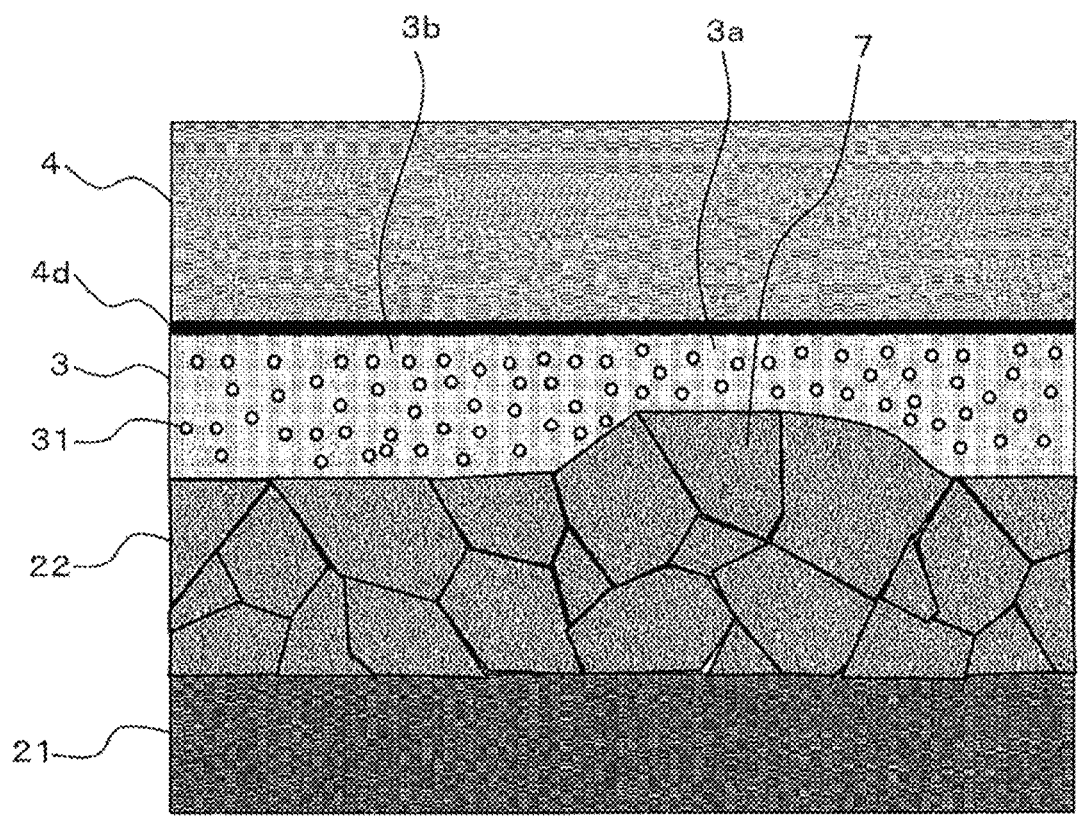

SEMICONDUCTOR DEVICE AND METHOD OF MANUFACTURING SEMICONDUCTOR DEVICE

CROSS REFERENCE TO RELATED APPLICATIONS

This application is a divisional application of U.S. patent application Ser. No. 15/740,873, filed on Dec. 29, 2017, which is a U.S. national stage application of PCT/JP2016/069099, filed on Jun. 28, 2016, which claims priority to Japanese Patent Application No. 2015-132894, filed Jul. 1, 2015, the disclosures of which are incorporated herein by reference in their entireties.

TECHNICAL FIELD

The present invention relates to a semiconductor device in which a semiconductor element and a circuit substrate are electrically connected.

BACKGROUND ART

A semiconductor device for power conversion used for an inverter control of a motor has a vertical semiconductor element such as an Insulated Gate Bipolar Transistor (IGBT), a Metal-oxide-semiconductor Field-effect Transistor (MOSFET), and a diode. A metalized electrode is formed in a front surface and a rear surface of the semiconductor element, in case of a general semiconductor device, a rear surface electrode located in the rear surface of the semiconductor element and a circuit substrate are connected with a solder joint part therebetween.

Since an amount of heat generation in the semiconductor element tends to increase, a high heat resistance performance is desired for a joint material used for the semiconductor device for power conversion. However, a lead-free solder material having the high heat resistance performance is not currently found, thus considered is that a sinter bonding technique using a sintering phenomenon of a metal grain is applied to the semiconductor device for power conversion as a technique of joining the material replaced with the solder joint. A sinter bonding material used for the sinter bonding technique is made up of a metal grain and an organic constituent. The sinter bonding technique indicates a technique of performing a junction with a joined member using a porous joint layer formed by the sintering phenomenon of the metal grain included in the sinter bonding material.

In a conventional semiconductor device, the rear surface electrode of the semiconductor element is joined to the circuit substrate using a sinter bonding material including silver (Ag) nanoparticle (refer to Patent Document 1, for example).

In another conventional semiconductor device, a high hardness particle made of one of copper (Cu) or Nickel (Ni) or both Cu and Ni, containing the Ag nanoparticle as a main constituent, is dispersed to the sinter bonding material to enhance the intensity of the joint layer at a time of joining the rear surface electrode of the semiconductor element to the circuit substrate (refer to Patent Document 2, for example).

PRIOR ART DOCUMENTS

Patent Documents

Patent Document 1: Japanese Patent Application Laid-Open No. 2007-214340

Patent Document 2: Japanese Patent Application Laid-Open No. 2012-124497

SUMMARY

Problem to be Solved by the Invention

Such a conventional semiconductor device described in Patent Document 1 or Patent Document 2 has a problem that in using the semiconductor device in a high temperature environment of 175 to 300° C., for example, a heat stress of the electrode and the joint layer of the circuit substrate occurring by a repetition of low temperature and high temperature causes a crack in the joint layer, thus a favorable joint reliability cannot obtained in some cases.

The present invention has been achieved to solve problems as described above, and it is an object of the present invention to provide a semiconductor device and a method of manufacturing the semiconductor device having a favorable reliability of a joint layer even when the semiconductor device having a joint layer formed of a sinter bonding material is used in a high temperature environment.

Means to Solve the Problem

A semiconductor device according to the present invention includes an insulating plate, an electrode being provided on the insulating plate and having a flat part and a non-flat part being made up of a concave part or a convex part, a joint layer being made of a sintered body of metal crystal grains provided on the flat part and the non-flat part of the electrode, and a semiconductor element being joined to the electrode with the joint layer therebetween, wherein the joint layer has a first region sandwiched between the non-flat part and the semiconductor element and a second region sandwiched between the flat part and the semiconductor element, and either one of the first region and the second region having a larger film thickness has a filling rate of the metal crystal grains smaller than the other one of the first region and the second region having a smaller film thickness.

A method of manufacturing a semiconductor device according to the present invention includes: providing a semiconductor element on an electrode being joined to an insulating plate and having a concave part or a convex part with a sinter bonding material containing metal nanoparticles therebetween; and joining the electrode and the semiconductor element by heating the insulating plate and the semiconductor element while applying pressure, sinter bonding the sinter bonding material, and forming a joint layer embedding the concave part or the convex part.

Effects of the Invention

According to the semiconductor device according to the present invention, the semiconductor device having the favorable reliability of the joint layer even in using the semiconductor device in the high temperature environment can be provided.

Moreover, according to the method of manufacturing the semiconductor device according to the present invention, the semiconductor device having the favorable reliability of the joint layer even in using the semiconductor device in the high temperature environment can be manufactured.

BRIEF DESCRIPTION OF DRAWINGS

FIG. 5 is a cross sectional view schematically illustrating an aspect of a joint layer of the semiconductor device according to the embodiment 1 of the present invention.

FIG. 13 is a cross sectional view schematically illustrating a structure near a joint layer of a semiconductor device according to an embodiment 4 of the present invention.

DESCRIPTION OF EMBODIMENT(S)

Embodiment 1

Figure 1:
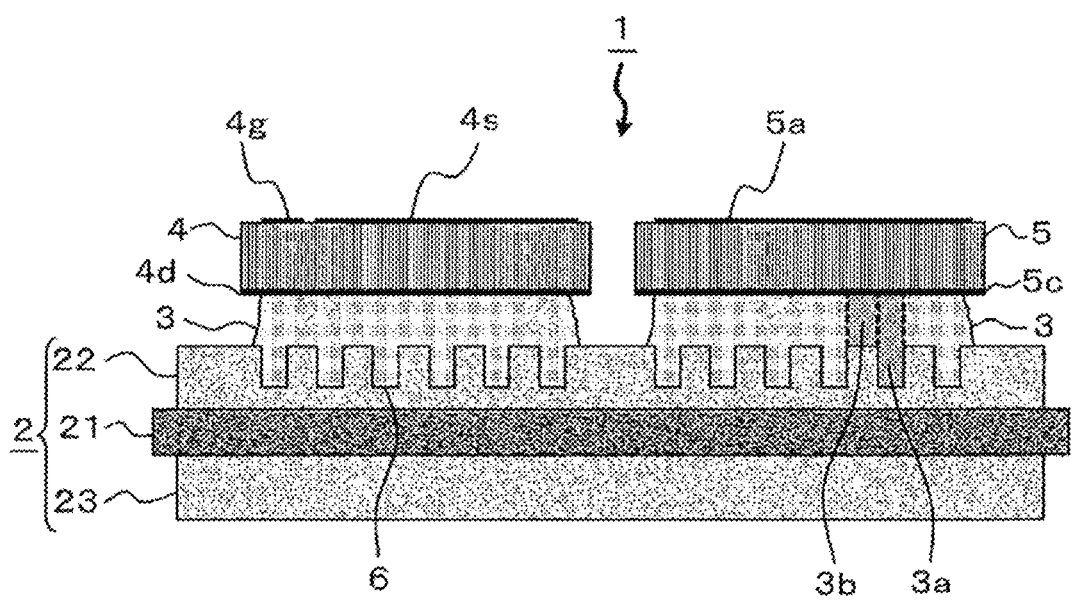
FIG. 1 is a schematic cross sectional view illustrating a main part of a semiconductor device according to an embodiment 1 of the present invention.
Figure 2:
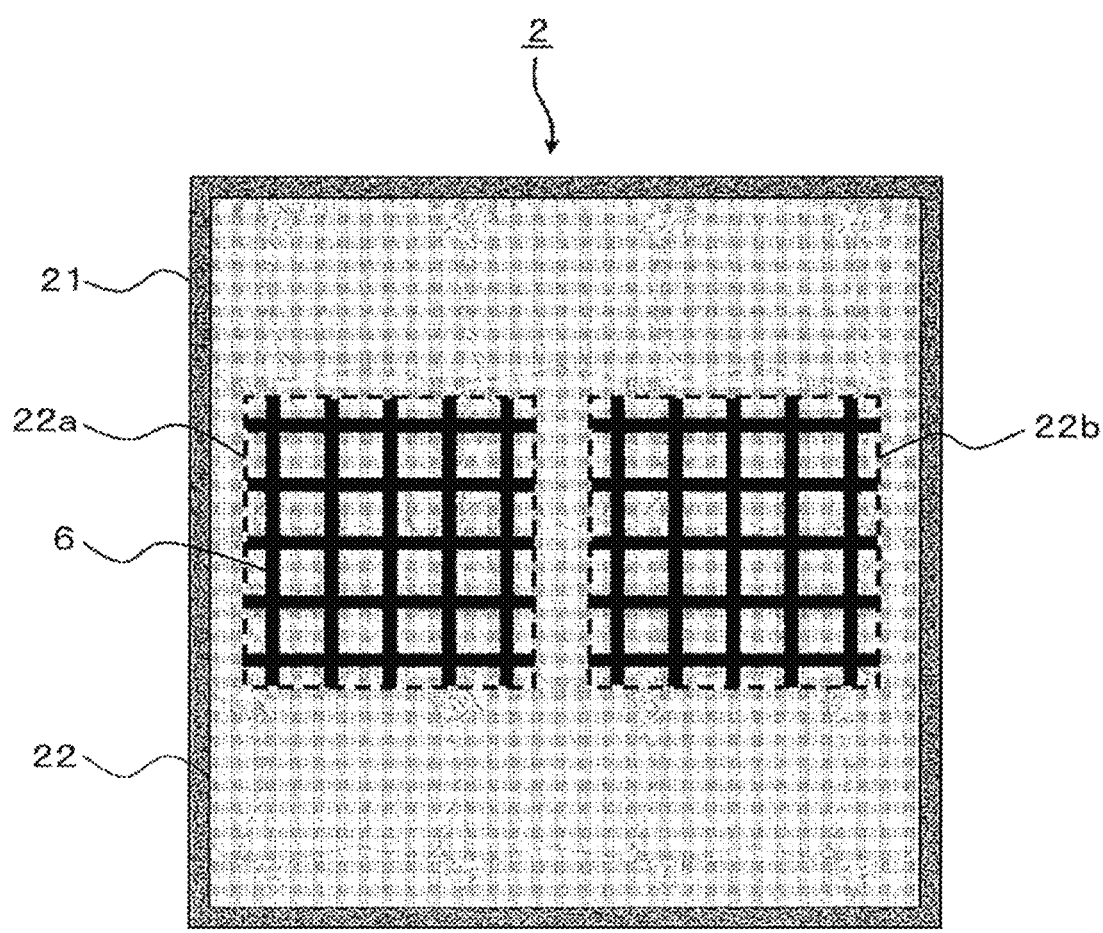
FIG. 2 is a top view illustrating a circuit substrate of the semiconductor device according to the embodiment 1 of the present invention.

Firstly, a configuration of a semiconductor device according to the embodiment 1 of the present invention is described. FIG. 1 is a schematic cross sectional view illustrating a main part of the semiconductor device according to the embodiment 1 of the present invention. FIG. 2 is a top view illustrating a circuit substrate of the semiconductor device according to the embodiment 1 of the present invention.

A semiconductor device 1 includes a circuit substrate 2 in which an electrode 22 and an electrode 23 formed of a metal such as copper (Cu) or Nickel (Ni) are provided in both surfaces of an insulting plate 21 formed of a silicon nitride ceramic plate, for example, and a first semiconductor element 4 and a second semiconductor element 5 joined to a surface of the electrode 22 of the circuit substrate 2 by a joint layer 3 made of a sintered body of metal crystal grains such as Ag.

As illustrated in FIG. 2, a concave-shaped part 6 formed by a mechanical processing, a press processing, or an etching processing, for example, is provided in each region of a joint region 22a joining the first semiconductor element 4 and a joint region 22b joining the second semiconductor element 5 on a side of the surface of the electrode 22 of the circuit substrate 2. In FIG. 1, the concave-shaped part 6 is formed to extend from the surface of the electrode 22 in a depth direction of the electrode 22, the electrode 22 being located in a bottom part of the concave-shaped part 6, however, the concave-shaped part 6 may be provided to pass through the electrode 22, and in this case, the insulating plate 21 may be a bottom part of the concave-shaped part 6. The remaining region which does not form the concave-shaped part 6 in the joint regions 22a and 22b in the electrode 22 forms a flat surface of the electrode 22 and thus forms a flat part.

The joint layer 3 is provided on the surface of the joint region 22a and the joint region 22b in the electrode 22, and the first semiconductor element 4 and the second semiconductor element 5 are joined to the electrode 22 by the joint layer 3. Actually, the joint regions 22a and 22b are not explicitly shown as a broken line illustrated in the electrode 22 of FIG. 2, however, the joint regions 22a and 22b are totally covered by the joint layer 3, thus the region covered by the joint layer 3 on the electrode 22 can be also referred to as the joint region. As illustrated in FIG. 1, the joint layer 3 is provided to embed an inner side of the concave-shaped part 6, and the joint layer 3 has a first region 3a being in contact with the concave-shaped part 6 and a second region 3b which is not in contact with the concave-shaped part 6. In FIG. 1, an area of the part where the concave-shaped part 6 is provided on the surface of the electrode 22 appears to be equal to an area of the part where the concave-shaped part 6 is not provided, however, a width of the concave-shaped part 6 is several hundred μm, thus the surface of the electrode 22 is largely occupied by a flat part where the concave-shaped part 6 is not provided.

In the first region 3a of the joint layer 3, a distance between the bottom part of the concave-shaped part 6 and rear surface electrodes 4d and 5c of the first and second semiconductor elements is defined as a layer thickness, and in the second region 3b of the joint layer 3, a distance between the surface of the electrode 22 where the concave-shaped part 6 is not provided and the rear surface electrodes 4d and 5c of the first and second semiconductor elements is defined as a layer thickness. Accordingly, the concave-shaped part 6 is formed on the surface side of the electrode 22, thus the layer thickness of the first region 3a is larger than that of the second region 3b. When the bottom part of the concave-shaped part 6 has a concave-surface shape, for example, differing from the case of FIG. 1, a part which has the largest distance with the rear surface electrodes 4d and 5c of the first and second semiconductor elements may be defined as the bottom part of the concave-shaped part 6, and the distance between this bottom part and the rear surface electrodes 4d and 5c may be defined as the layer thickness of the first region 3a.

The joint layer 3 is a sintered body containing a plurality of metal crystal grains and has an organizational form that a large number of minute pores of submicron size peculiar to the sintered body are uniformly dispersed. Thus, a filling rate of the metal crystal grain in the joint layer 3 is below 100%, and the filling rate decreases with increase in the number of pores. In the semiconductor device 1 according to the embodiment 1 of the present invention, the filling rate of the metal crystal grain in the first region 3a in the joint layer 3 is smaller than the filling rate of the metal crystal grain in the second region 3b. The filling rate of the metal crystal grain in the joint layer 3 is preferably equal to or larger than 80% and smaller than 100% in the second region 3b to increase a bonding strength of the joint layer 3. The filling rate of the metal crystal grain in the first region 3a needs to be smaller than the filling rate of the metal crystal grain in the second region 3b, and it is particularly preferable that the filling rate is equal to or larger than 20% and smaller than 80% in the first region 3a.

Herein, the layer thickness of the electrode 22 may be 200 to 1000 μm, for example. The width of the concave-shaped part 6 formed in the electrode 22, that is to say, the width of the groove shape illustrated by the cross section in FIG. 1 in a horizontal direction of a drawing sheet may be 100 to 300 μm, for example. Although the depth of the concave-shaped part 6 may be deep enough to pass through the electrode 22 as described above, it is preferably 20 to 100 μm for easy processing. The width of the concave-shaped part 6 is preferably larger than the depth to form the joint layer 3 into the concave-shaped part 6, and it is particularly preferable that a ratio between the width and the depth, that is to say, the width/the depth is 2 to 8. The distance between the joint layer 3 and the electrode 22, that is to say, the layer thickness of the second region 3b in the joint layer 3 may be 20 to 100 μm, for example.

A ceramic plate made of alumina or aluminum nitride as well as silicon nitride can be used for the insulating plate 21 of the circuit substrate 2. Since the semiconductor device 1 has a large amount of heat generation by reason that it is used for power generation, the insulating plate 21 is preferably made of a material having a thermal conductivity equal to or larger than 20 W/m·k to enhance a heat radiation from the semiconductor device 1, a material having a thermal conductivity equal to or larger than 70 W/m·k is moreover preferable.

The first semiconductor element 4 and the second semiconductor element 5 are formed of a wide band gap semiconductor material such as silicon carbide (SiC), gallium nitride (GaN), gallium arsenic (GaAs), or diamond (C) having a band gap larger than silicon (Si). One of or both the first semiconductor element 4 and the second semiconductor element 5 may be the semiconductor elements formed of silicon (Si). In the semiconductor device 1 in FIG. 1, the first semiconductor element 4 is a MOSFET, for example, and the second semiconductor element 5 is a Schottky Barrier Diode (SBD), for example, however, each of the first semiconductor element 4 and the second semiconductor element 5 may be another type of semiconductor element such as an IGBT. The number of semiconductor elements is not limited to two, but one or three or more semiconductor elements are also applicable.

The drain electrode 4d which is the rear surface electrode is provided on the rear surface side of the MOSFET which is the first semiconductor element 4, and a source electrode 4s and a gate electrode 4g which are front surface electrodes are provided on the front surface side thereof. The cathode electrode 5c which is the rear surface electrode is provided on the rear surface side of the SBD which is the second semiconductor element 5, and an anode electrode 5a which is a front surface electrode is provided on the front surface side thereof. A wiring member is joined to the electrode 22 to which the drain electrode 4d and the cathode electrode 5c, which are the rear surface electrodes of each semiconductor element, are joined (not shown), another wiring member is also joined to the source element 4s and the gate electrode 4g which are the front surface electrode and the anode electrode 5a of the SBD (not shown), and the semiconductor device 1 is electrically connected to an external circuit by these wiring members. In a manner similar to the general semiconductor device, the first semiconductor element 4 and the second semiconductor element 5 are covered by a sealing body or a case, for example, and a heat radiation member such as a heat spreader is provided in the electrode 23 of the circuit substrate 2 (not shown). The heat radiation member may also be directly joined to the circuit substrate 2, from which the electrode 23 is removed, instead of the electrode 23.

The semiconductor device 1 according to the embodiment 1 of the present invention is configured as described above. When the semiconductor device 1 having the above configuration is used in a high temperature environment of 175 to 300° C., for example, a stress is added to the joint layer 3. At this time, however, a crack preferentially occurs in the first region 3a having the small filling rate of the metal crystal grain, and this crack reduces the stress on the joint layer 3, and subsequently, the occurrence of the crack in the second region 3b is suppressed. As a result, an adhesion strength between the electrode 22, and the first and second semiconductor elements 4 and 5 is not reduced, thus the semiconductor device 1 having the high joint reliability can be obtained.

As described above, the semiconductor device 1 according to the embodiment 1 of the present invention has a feature that the concave-shaped part 6 is formed in a predetermined pattern in the electrode 22, and the filling rate of the metal crystal grain of the joint layer 3 is controlled in accordance with the forming pattern, thus the region where the crack occurs and the region where the occurrence of the crack is suppressed can be controlled.

Next, a principle that the occurrence and suppression of the crack in the joint layer 3 can be controlled is described after describing a method of manufacturing the joint layer 3 of the semiconductor device 1.

The joint layer 3 is formed by supplying a sinter bonding material, in which metal nanoparticles such as Ag nanoparticles covered by an organic protection film are dispersed in an organic constituent to have a paste form or a sheet-like shape, between the electrode 22 and the first semiconductor element 4 and second semiconductor element 5, and heating the sinter bonding material at a junction temperature (250° C. in case of the Ag nanoparticle) while applying pressure to sinter bond the plurality of metal nanoparticles. When the electrode 22 is formed of Cu or Ni which is easily oxidized, it is preferable to use a sinter bonding material which can remove an oxide layer and contains a reducing agent which can be volatilized at the junction temperature or lower.

The sinter bonding material is a bonding material using a phenomenon that a metal is sintered at a temperature lower than a melting point indicated in bulk due to a reactivity of the metal nanoparticle (the metal fine particle) of nanometer level. A metal nanoparticle made of a single metal classified in a noble metal such as gold (Au), copper (Cu), palladium (Pd), and Platinum (Pt), and a metal nanoparticle made of an alloy containing the noble metal such as Ag—Pd, Au—Si, Au—Ge, and Au—Cu, as well as the Ag nanoparticle described above, can be used for the sinter bonding material described in the present invention. In the above metal nanoparticles, the Ag nanoparticle, being a metal which is hardly oxidized so that the sintering is not interfered and can be used at a relatively low cost, is preferable by reason that the semiconductor device 1 can be manufactured at low cost. The electrode 22 of the circuit substrate 2 made of Cu is particularly preferable for its favorable joint performance.

Since the metal nanoparticle has the high reactivity, the sintering proceeds with just a contact between the metal nanoparticle even at normal temperature. Thus, the metal nanoparticles used for the sinter bonding material are covered by the organic protection film to suppress a clumping of the metal nanoparticles and a progression of the sintering reaction, and are dispersedly held in a state where each metal nanoparticle is separated from each other. It is preferable to use a material which can be volatilized or decomposed and separated at the junction temperature or lower for the organic protection film and the organic constituent dispersing the metal nanoparticles.

In the sinter bonding material, since the organic constituent is decomposed and the metal nanoparticles are sinter bonded by the application of heat in forming the joint layer 3, a volume of the joint part after the junction is reduced to ½ to ¼ of a volume of the sinter bonding material supplied to the joint part before the application of heat. Thus, the heat is applied with adding the pressure at the time of forming the joint layer 3 to obtain the joint part which has less void and therefore has the high reliability. The joint layer 3 formed in the above manner has the organizational form that the large number of minute pores of submicron size peculiar to the sintered body are uniformly dispersed. As described above, the joint layer 3 has the large number of pores, and the favorable joint reliability can be obtained by setting the filling rate of the crystal grain to 80% or larger. The filling rate mentioned herein is a filling rate of the second region 3b in a part of the joint layer 3 which is not in contact with the concave-shaped part 6.

The sinter bonding material containing the metal nanoparticle having an average grain size of 50 nm or smaller is particular preferable. The reason is that when the average grain size of the metal nanoparticle is 50 nm or smaller, an average grain size of the crystal grain contained in the joint layer 3, which is a sintered body made by supplying the sinter bonding material to the joint part and applying the pressure and heat, can be kept to 150 nm or smaller, thus the joint layer 3 having a favorable deformability can be formed as described hereinafter. The metal nanoparticle, in the sinter bonding material, having the small average grain size is preferable also by reason of increasing the filling rate of the second region 3b in the joint layer 3 to 80% or larger, and the metal nanoparticle having the average grain size of 50 nm or smaller is particularly preferable.

After the sinter bonding material is supplied on each joint region of the joint region 22a joining the first semiconductor element 4 and the joint region 22b joining the second semiconductor element 5 in the electrode 22, the first semiconductor element 4 and the second semiconductor element 5 are disposed on the supplied sinter bonding material, and then the pressure and heat is applied to join the first semiconductor element 4 and the second semiconductor element 5 to the electrode 22. Although the joint layer 3 is formed in the manner described above, the concave-shaped part 6 is provided in the electrode 22, so that when the first and second semiconductor elements 4 and 5 are joined with applying the pressure, a compressibility of the sinter bonding material caused by the application of the pressure is different between the first region 3a which is in contact with the concave-shaped part 6 and the second region 3b which is not in contact with the concave-shaped part 6 in the joint layer 3. As a result, the filling rate of the metal crystal grain in the first region 3a gets smaller than the filling rate of the metal crystal grain in the second region 3b in the joint layer 3, thus the crack can be easily caused to occur in the first region 3a in the joint layer 3.

As described above, in the semiconductor device 1 of the present invention, the area where the crack is caused to occur in the joint layer 3 can be controlled by providing the concave-shaped part 6 in the predetermined part of the electrode 22, thus the crack can be caused to occur in the predetermined area to reduce the stress on the whole joint layer 3, and moreover, the crack occurring in the joint layer 3 can be stayed locally, so that the joint reliability of the joint layer 3 can be enhanced. In the joint layer 3, since the filling rate of the second region 3b is set to 80% or larger and the filling rate of the first region 3a is set to be smaller than that of the second region 3b or equal to or larger than 20% and smaller than 80%, the occurrence of the crack in the first region 3a and the suppression of the occurrence of the crack in the second region 3b can be reliably performed, and the joint reliability of the joint layer 3 can be further enhanced. As described above, since the joint layer 3 includes the large number of pores by reason that the joint layer 3 is the sintered body of the metal crystal grain, the filling rate of the second region 3b cannot be set to 100%, however, the adhesion strength is increased with increase in the filling rate of the second region 3b, thus the filling rate of the second region 3b is preferably set equal to or larger than 80% and smaller than 100%.

A hardness of the electrode 22 of the circuit substrate 2 is preferably smaller than that of the joint layer 3 to cause the crack to occur in the first region 3a in the joint layer 3 more reliably. The hardness of the joint layer 3 mentioned herein is a hardness of the second region 3b which is not in contact with the concave-shaped part 6. The hardness of the electrode 22 and the second region 3b in the joint layer 3 may be compared in accordance with Vickers hardness, for example.

Even when the hardness of the electrode 22 is equal to that of the second region 3b of the joint layer 3, or even when the hardness of the electrode 22 is larger, the first region 3a being in contact with the concave-shaped part 6 has the small filling rate of the metal crystal grain, thereby having the structure in which the crack easily occurs, thus the crack occurs in the first region 3a by the stress in using the semiconductor device in the high temperature environment, and the stress on the joint layer 3 is reduced. However, the hardness of the electrode 22 of the circuit substrate 2 is preferably smaller than that of the joint layer 3 to cause the crack to occur in the first region 3a more reliably.

The hardness of the electrode 22 may be made to be smaller by softening the electrode 22 through an annealing by the application of heat at the time of joining the electrode 22 to the insulating plate 21 by a brazing or casting to manufacture the circuit substrate 2, for example. When the electrode 22 is annealed, the grain size of the crystal grain in the electrode 22 is coarsened, thus it is preferable to set the average grain size of the crystal grain in the electrode 22 to be approximately 100 μm and soften the electrode 22 so as to have Vickers hardness of 50 HV or smaller, for example. The crystal grain size can be evaluated by a method of Electron Backscatter Diffraction (EBSD). A crystal orientation in a grain boundary is defined as 5° or larger and a sample is evaluated, and a shape displayed as an image is measured to measure the crystal grain size. A crystal grain size of a sintered body constituting the joint layer 3 described hereinafter can also be evaluated in the similar manner.

Next, an experimental result performed to investigate characteristics of the joint layer 3 is described. Firstly, a method of preparing the sample used for the experiment is described.

A sinter bonding material containing Ag nanoparticles having an average grain size of 50 nm as metal nanoparticles is printed and supplied on a glass substrate to have a thickness of 100 to 200 and a solvent component is dried. Subsequently, the sinter bonding material is sandwiched between the glass plate and the other glass plate, and heat and pressure are applied in a joint condition of temperature of 260 to 350° C., welding pressure of 10 to 30 MPa, and holding time of 90 to 300 seconds to prepare a sintered body sample A. An average crystal grain size of the sintered body sample A is 150 nm. Next, the sintered body prepared by the above method in the manner similar to the sintered body sample A is pressureless heated at a temperature of 350° C. for 60 minutes to prepare a sintered body sample B whose crystal grain is thereby coarsened. An average crystal grain size of the sintered body sample B is 300 nm. Vickers hardness of the sintered body sample A and the sintered body sample B is equal to or larger than 70 HV, and Vickers harness of the electrode 22 of the circuit substrate 2 in the semiconductor device 1 is equal to or smaller than 50 HV, so that the sintered body sample A and the sintered body sample B have Vickers hardness larger than the electrode 22.

Figure 3:
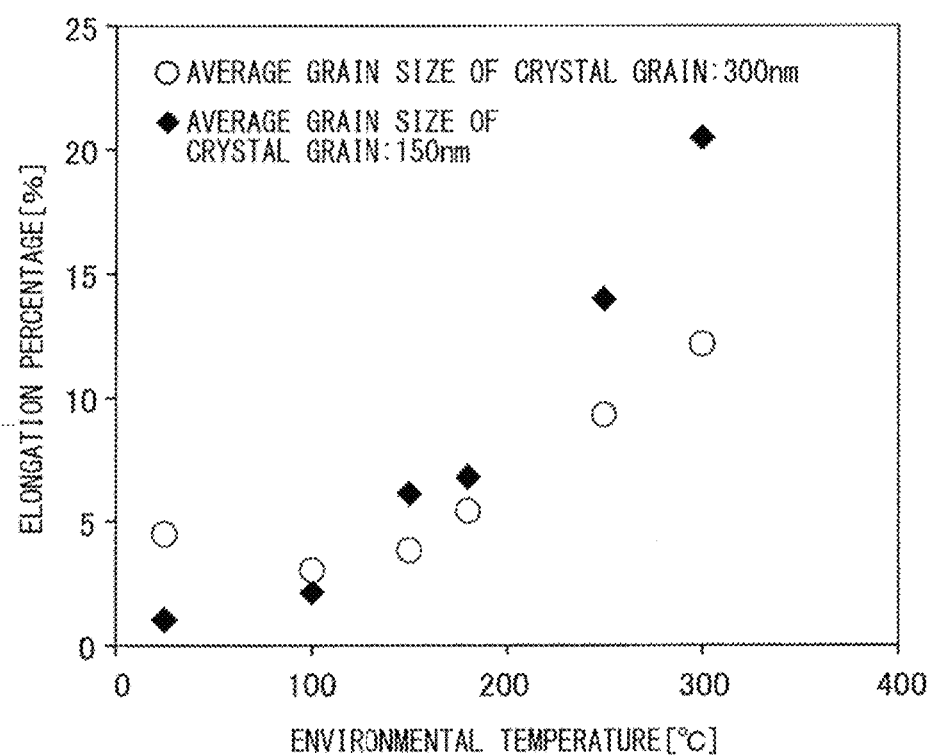
FIG. 3 is a drawing illustrating an experimental result of a tensile test of a sintered body sample according to the embodiment 1 of the present invention.

The sintered body sample A and the sintered body sample B prepared by the above method are evaluated by a tensile test in which an environmental temperature is changed. FIG. 3 is a drawing illustrating an experimental result of the tensile test of the sintered body sample. FIG. 3 illustrates a relationship between the environmental temperature and an elongation percentage of the sintered body sample A and the sintered body sample B. The elongation percentage is a percentage of the elongation of the sintered body sample until its fracture in the tensile test, and indicates that a material has a higher deformability as the elongation percentage gets larger. As illustrated in FIG. 3, it is found that in the case of the sintered body formed by sinter bonding the Ag nanoparticles, the elongation percentage of the sintered body increases with increase in environmental temperature, thus the deformability increases.

Figure 4:
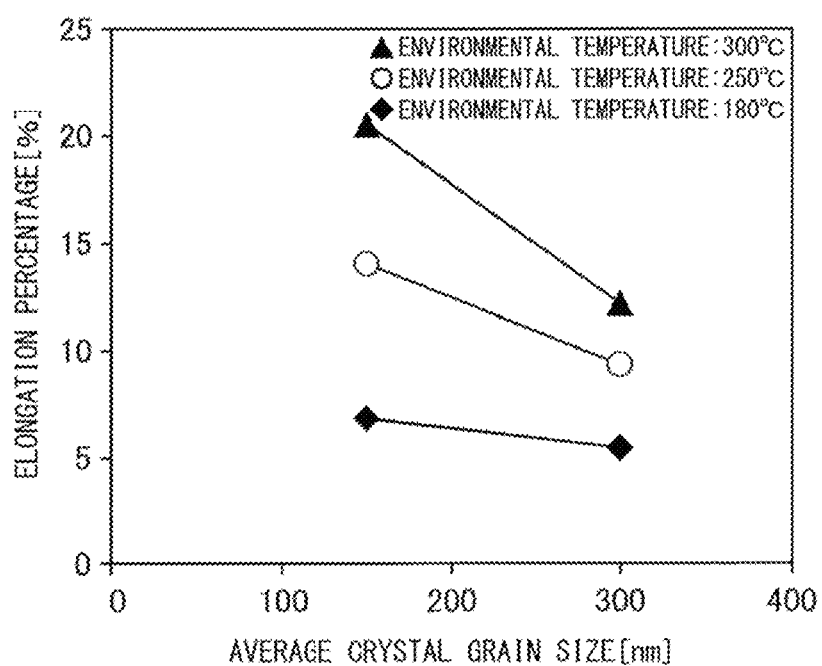
FIG. 4 is a drawing illustrating an experimental result of a tensile test of the sintered body sample according to the embodiment 1 of the present invention.

FIG. 4 is a drawing illustrating an experimental result of the tensile test of the sintered body sample. FIG. 4 illustrates a relationship between an average grain size of a crystal grain and an elongation percentage of the sintered body sample, using the environmental temperature as a parameter. As illustrated in FIG. 4, it is found that in the case of the sintered body formed by sinter bonding the Ag nanoparticles, the elongation percentage of the sintered body increases with decrease in average grain size of the crystal grain, thus the deformability increases.

Although FIG. 3 and FIG. 4 illustrate the case where the metal nanoparticle in the sinter bonding material is the Ag nanoparticle, also in the case of the sintered body formed of another metal nanoparticle, the elongation percentage increases with increase in environmental temperature, and the elongation percentage increases with decrease in average grain size of the crystal grain in the sintered body.

Since the semiconductor element formed of a wide band gap semiconductor material such as silicon carbide has a junction temperature of operating limit higher than the semiconductor element formed of silicon, it is used in a high temperature environment in some cases. Although the semiconductor device using the semiconductor element formed of silicon can be used only in a state where the joint part 3 has a temperature of substantially 150° C. or lower, the semiconductor device using the semiconductor element formed of silicon carbide is used in a state where the joint part 3 has a high temperature such as 250° C., in some cases. It is preferable to apply the joint layer 3 having the high deformability to the semiconductor device 1 which may be used at normal temperature or in the environment where the temperature changes from sub-zero range to the high temperature such as 250° C., thus the average grain size of the crystal grain in the sintered body of the joint layer 3 is preferably small.

As illustrated in FIG. 3, when the average grain size of the crystal grain in the sintered body of the joint layer 3 is 150 nm, the elongation percentage of 7% can be obtained at the environmental temperature of 175° C., thus the favorable joint reliability can be obtained even by the semiconductor device formed of the wide band gap semiconductor material. That is to say, the average grain size of the crystal grain in the sintered body of the joint layer 3 is preferably 1 to 150 nm when the sintered body of the joint layer 3 is used for the semiconductor device formed of the wide band gap semiconductor material. Although it is preferable to reduce the average grain size of the crystal grain in the sintered body of the joint layer 3 by reason that the deformability increases, the average grain size of the metal nanoparticle contained in the sinter bonding material before the sintering used to form the sintered body needs to be small to reduce the average grain size of the crystal grain, and such a sinter bonding material is expensive. Moreover, the heating temperature and the pressure applied at the time of preparing the sintered body needs to be controlled with a high degree of accuracy, so that a manufacturing facility is also expensive. When the semiconductor device 1 formed of the wide band gap semiconductor material is used in a state where the joint layer 3 has the temperature of 300° C. or lower, the average grain size of the crystal grain in the sintered body of the joint layer 3 is preferably 10 to 150 nm to reduce a cost of the semiconductor device 1.

Described next is an experimental result of comparing the semiconductor device according to the embodiment 1 of the present invention with a conventional semiconductor device by a thermal cycle test. The semiconductor device 1 according to the embodiment 1 of the present invention is the semiconductor device in which the concave-shaped part 6 is provided in the electrode 22 of the circuit substrate 2 as described above, and the conventional semiconductor device is a semiconductor device in which a concave-shaped part is not provide in an electrode of a circuit substrate. That is to say, there is only a difference whether or not the concave-shaped part is provided in the electrode of the joint part.

In the semiconductor device 1 according to the embodiment 1, the sinter bonding material containing the Ag nanoparticles having the average grain size of 50 nm as the metal nanoparticles is printed and supplied on the electrode 22 of the circuit substrate 2 to have the thickness of 100 to 200 μm, and the solvent component is dried. Subsequently, the first semiconductor element 4 and the second semiconductor element 5 are disposed, and the heat and the pressure are applied in the joint condition of temperature of 260 to 350° C., welding pressure of 10 to 30 MPa, and holding time of 90 to 300 seconds to form and join the joint layer 3 which is the sintered body. The joint layer 3 which has been formed has the average grain size of the crystal grain of 150 nm or smaller and Vickers hardness of 70 HV or larger, and the electrode 22 of the circuit substrate 2 has the crystal grain size of approximately 100 μm and Vickers hardness of 50 HV or smaller.

The conventional semiconductor device is also prepared by the same steps as those in the semiconductor device according to the embodiment 1 described above. Also in the conventional semiconductor device, the joint layer 3 which has been formed has the average grain size of the crystal grain of 150 nm or smaller and Vickers hardness of 70 HV or larger, and the electrode 22 of the circuit substrate 2 has the crystal grain size of approximately 100 μm and Vickers hardness of 50 HV or smaller.

Figure 6:
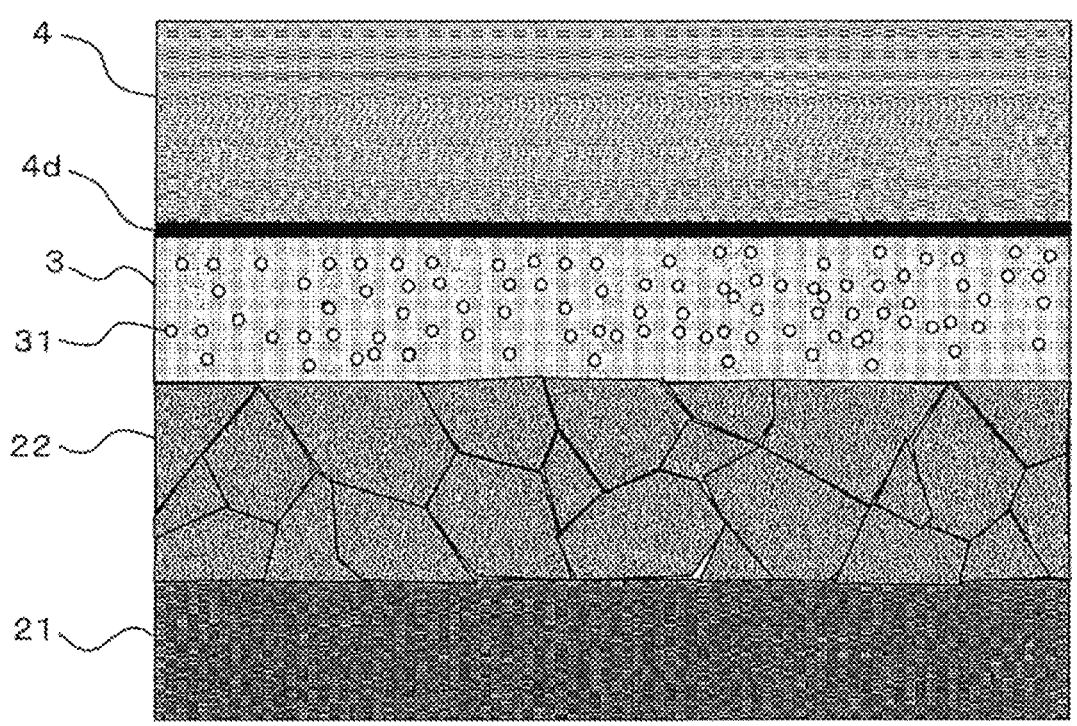
FIG. 6 is a cross sectional view schematically illustrating an aspect of a joint layer of a conventional semiconductor device.

FIG. 5 is a cross sectional view schematically illustrating an aspect of the joint layer of the semiconductor device according to the embodiment 1 prepared by the method described above. FIG. 6 is a cross sectional view schematically illustrating an aspect of the joint layer of the conventional semiconductor device prepared by the method described above. Each of FIG. 5 and FIG. 6 illustrates an aspect of the joint layer of the semiconductor device before the thermal cycle test.

As illustrated in FIG. 5, the joint layer 3 of the semiconductor device according to the embodiment 1 has the organizational form that the large number of minute pores 31 of submicron size peculiar to the sintered body are dispersed, however, a density of the pores 31 is different between the first region 3a which is in contact with the concave-shaped part 6 formed in the electrode 22 and the second region 3b which is not in contact with the concave-shaped part 6. That is to say, the density of the pores 31 in the first region 3a is larger than that of the pores 31 in the second region 3b. This indicates that the first region 3a has the smaller filling rate of the metal crystal grain than the second region 3b in the joint layer 3. In the prepared semiconductor device 1 according to the embodiment 1 of the present invention, the filling rate of the metal crystal grain in the first region 3a in the joint layer 3 is 30% to 60%, and the filling rate of the metal crystal grain in the second region 3b is equal to 80% or larger.

In the meanwhile, as illustrated in FIG. 6, the conventional semiconductor device has the organizational form that the large number of minute pores 31 of submicron size peculiar to the sintered body are dispersed in the joint layer 3, in the manner similar to the semiconductor device 1 according to the embodiment 1, however, the density of the pores 31 is nearly even in the entire region of the joint layer 3. The prepared conventional semiconductor device has the filling rate of the metal crystal grain in the joint layer 3 nearly even in the entire region of the joint layer 3, that is equal to 80% or larger.

The semiconductor device 1 according to the embodiment 1 and the conventional semiconductor device prepared as described above are compared by the thermal cycle test. In the thermal cycle test, a pattern of increasing the temperature from 100° C. to 250° C. in one minute, keeping the temperature at 250° C. for five seconds, decreasing the temperature from 250° C. to 100° C. in one minute, and then keeping the temperature at 100° C. for five seconds is defined as one cycle, and this cycle is performed 8000 times.

Figure 7:
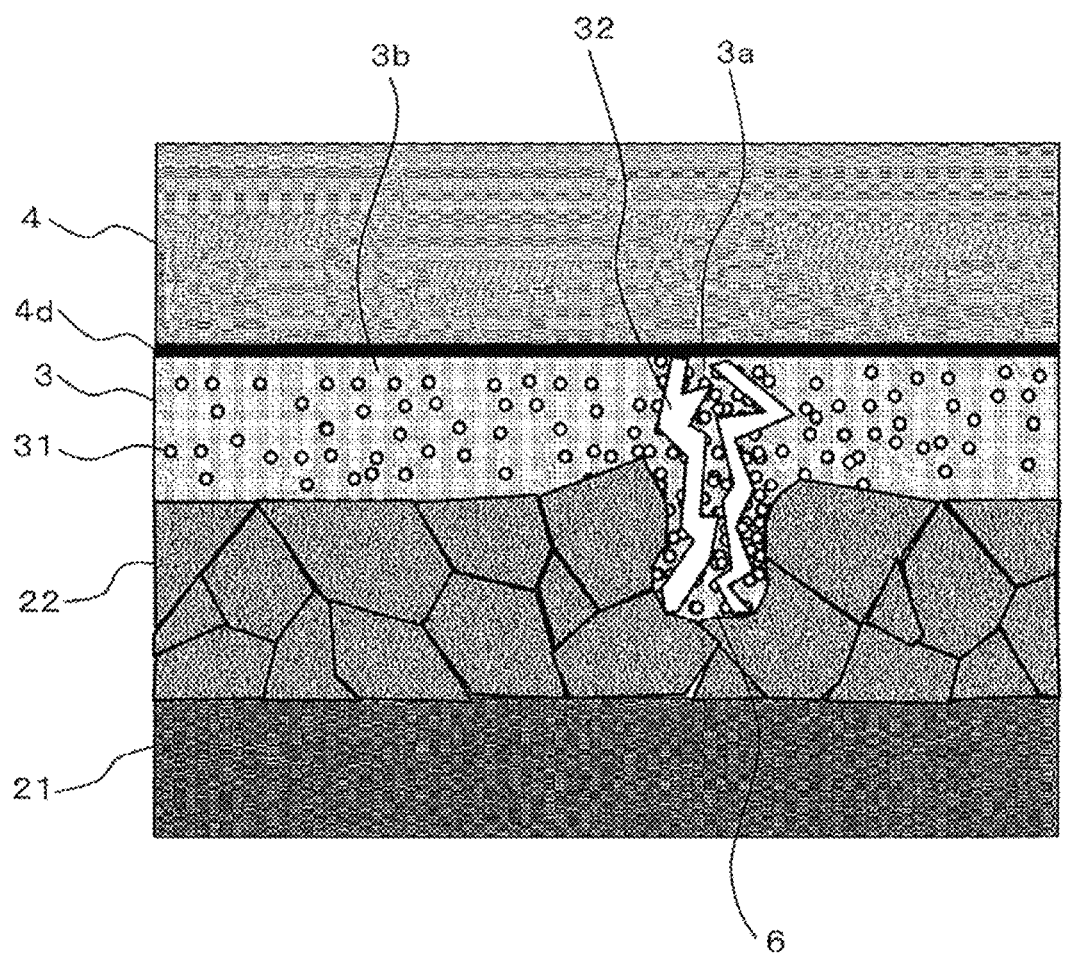
FIG. 7 is a cross sectional view schematically illustrating an aspect of a joint layer after a thermal cycle test of the semiconductor device according to the embodiment 1 of the present invention.
Figure 8:
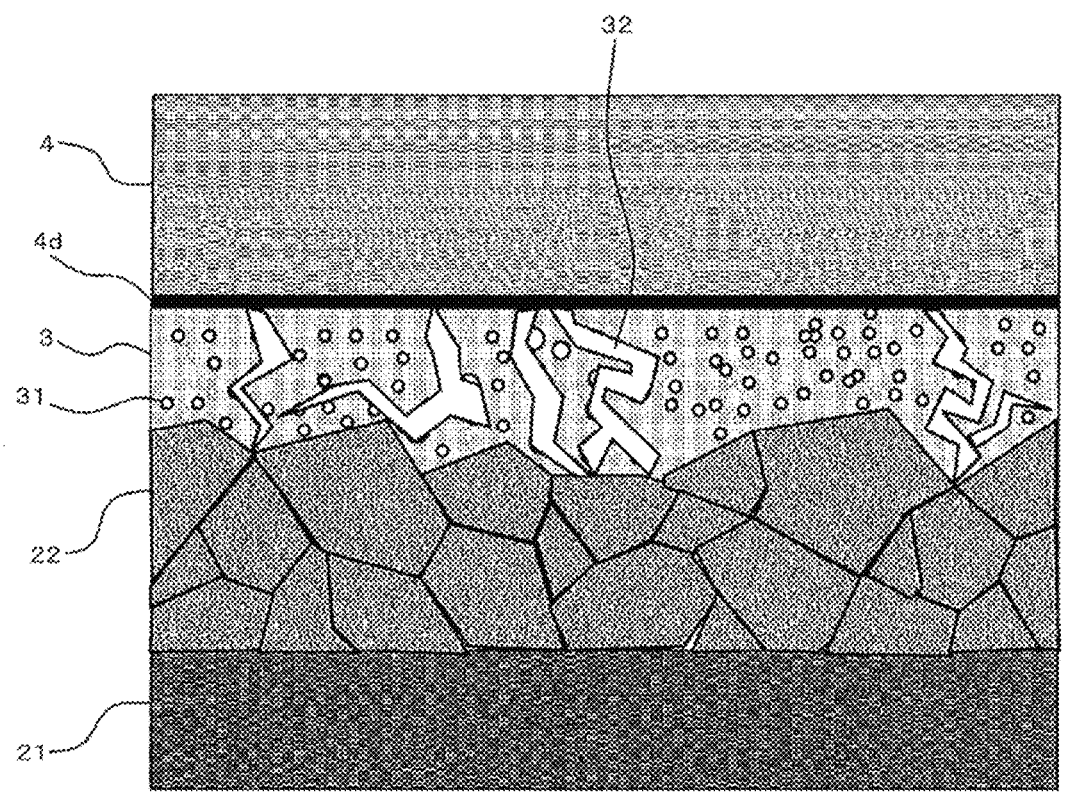
FIG. 8 is a cross sectional view schematically illustrating an aspect of a joint layer after a thermal cycle test of a conventional semiconductor device.

FIG. 7 is a cross sectional view schematically illustrating an aspect of the joint layer after the thermal cycle test of the semiconductor device according to the embodiment 1. FIG. 8 is a cross sectional view schematically illustrating an aspect of the joint layer after the thermal cycle test of the conventional semiconductor device.

As illustrated in FIG. 7, in the semiconductor device according to the embodiment 1, the part where the concave-shaped part 6 is formed is deformed to have an undulating shape, however, the part away from the concave-shaped part 6 is hardly deformed in the electrode 22 of the circuit substrate 2. This is because when a low temperature state and a high temperature state are repeated in the thermal cycle test, each crystal grain constituting the electrode 22 of the circuit substrate 2 is deformed in each preferential sliding direction, and the part where the concave-shaped part 6 is formed in the electrode 22 is easily deformed, thereby being preferentially deformed to have the undulating shape. Herein, since the first region 3a of the joint layer 3 has the filling rate of the metal crystal grain smaller than the second region 3b, a crack 32 preferentially occurs in the first region 3a in the joint layer 3. As a result, the stress on the joint layer 3 is reduced, and a large deterioration is not shown from here, thus the favorable joint performance is achieved. As described above, since the concave-shaped part 6 is formed in the electrode 22 to form the first region 3a and the second region 3b having the different metal filling rate in the joint layer 3, the occurrence of the crack 32 in the joint layer 3 can be suppressed in a localized area, and the crack 32 can be caused to occur by design. Since the crack 32 is caused to occur by design, the stress on the entire joint layer 3 can be reduced, the crack 32 occurring in the joint layer 3 can be locally stayed within the first region 3a, and the occurrence of the crack 32 in the second region 3b, which is the region other than the first region 3a in the joint layer 3, can be suppressed.

In the meanwhile, in the conventional semiconductor device as illustrated in FIG. 8, the surface of the electrode 22 of the circuit substrate 2 is deformed over the entire area, and the crack 32 occurs in the entire region in the joint layer 3. Since the electrode 22 of the circuit substrate 2 is attached to the insulating plate 21 by a brazing or casting, the electrode 22 is annealed by a thermal history at the time of preparation, and its crystal grain size increases to approximately 100 μm and its hardness therefore decreases. In the meanwhile, since the heat of 260 to 350° C., which is the relatively low, and pressure are applied to the metal nanoparticles to sinter the metal nanoparticles in the joint layer 3, the joint layer 3 is not annealed and therefore has a relatively large hardness. As described above, since the electrode 22 of the circuit substrate 2 has the hardness smaller than the joint layer 3 and is therefore soft, each crystal grain constituting the electrode 22 of the circuit substrate 2 is deformed in each preferential sliding direction by the thermal stress due to the repetition of the low temperature state and the high temperature state in the thermal cycle test, and the electrode 22 is deformed to have an undulating shape over the entire area by reason that the concave-shaped part is not provided in the electrode 22, differing from the semiconductor device 1 according to the embodiment 1. As a result, it is considered that a large thermal stress occurs in the joint layer 3, and the joint layer 3 cannot follow the deformation of the electrode 22, so that the crack 32 occurs over the entire region of the joint layer 3.

An adhesion strength is measured to evaluate joint reliability of the semiconductor device according to the embodiment 1 and the conventional semiconductor device after the thermal cycle test. For measuring the adhesion strength, a load is applied to the semiconductor element (chip), and a strength with which the semiconductor element is peeled from the electrode 22 of the circuit substrate 2 (unit: MPa) is measured, using a shear-measuring device (manufactured by Dage corporation: shear-measuring device HS4000). As a result, the adhesion strength of the semiconductor device 1 according to the embodiment 1 is 40 MPa, and the adhesion strength of the conventional semiconductor device is 20 MPa. As described above, the semiconductor device 1 according to the embodiment 1 can stay the occurrence of the crack 32 within the first region 3a which is in contact with the concave-shaped part 6 in the joint layer 3, thus the excellent joint reliability can be obtained, however, the crack 32 occurs in the entire region in the joint layer 3 in the conventional semiconductor device, so that the sufficient joint reliability cannot be obtained.

As described above, in the semiconductor device according to the embodiment 1 of the present invention, the concave-shaped part 6 is provided in the part of the joint surface of the electrode 22 of the circuit substrate 2, thus the first region 3a being in contact with the concave-shaped part 6 has the filling rate of the metal crystal grain smaller than the second region 3b, which is the region other than the first region 3a in the joint layer 3 which is the sintered body. Accordingly, the area where the electrode 22 is deformed and the crack 32 occurs in the joint layer 3 in the high temperature environment can be easily limited. As a result, the above configuration has an effect that the localized crack 32 is caused to occur by design, thus the stress on the entire joint layer 3 can be reduced, and the occurrence of the localized crack 32 enables the significant enhancement of the joint reliability thereafter.

The average grain size of the crystal grain in the joint layer 3 is set to 1 to 150 nm, preferably to 10 to 150 nm, thus the joint layer 3 having the excellent deformability even in the high temperature environment can be obtained, and the occurrence of the crack 32 in the second region 3b which is not in contact with the concave-shaped part 6 of the joint layer 3 can be suppressed, thus the above configuration has the effect that the favorable joint reliability can be obtained even in the semiconductor device having the semiconductor element formed of the wide band gap semiconductor material used in the higher temperature environment than the semiconductor device having the conventional silicon semiconductor.

Next, a method of manufacturing the semiconductor device according to the embodiment 1 of the present invention is described. FIGS. 9A to 9E are drawings illustrating the method of manufacturing the semiconductor device according to the embodiment 1 of the present invention.

Figure 9A:
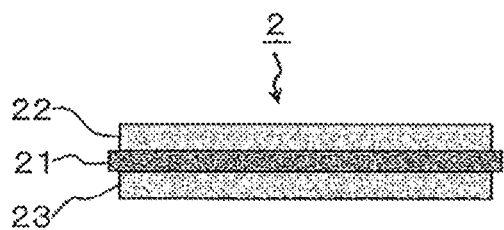
FIGS. 9A to 9E are drawings illustrating a method of manufacturing the semiconductor device according to the embodiment 1 of the present invention.

Firstly, as illustrated in FIG. 9A, the electrodes 22 and 23 formed of a metal such as Cu, Al, and Ni are joined to the both surfaces of the insulating plate 21 formed of a silicon nitride ceramic plate, for example, by a brazing or casting to form the circuit substrate 2. The metal forming the electrodes 22 and 23 may be a single metal, however, an alloy containing Cu, Al, or Ni, for example, is also applicable. The electrodes 22 and 23 are annealed by the heat applied at this time. Accordingly, the brazing or the casting for joining the electrodes 22 and 23 to the insulating plate 21 is performed while annealing the metal forming the electrodes 22 and 23.

Although a condition of the annealing differs depending on the type of metal, when copper or a copper alloy is used, for example, the softening starts at a temperature of 200 to 300° C., and the softening proceeds and the hardness decreases with increase in heating temperature and heating period. That is to say, the heating temperature at the time of the annealing is equal to or higher than a temperature at which the softening starts and smaller than a melting point of the metal. In the semiconductor device of the present invention, the electrode 22 preferably has Vickers hardness of 50 HV or smaller, thus the annealing is performed by combining the heating temperature and the heating period so that the electrode 22 has Vickers hardness of 50 HV or smaller.

Figure 9B:
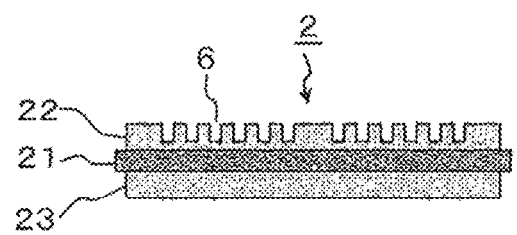

Next, as illustrated in FIG. 9B, the concave-shaped part 6 is formed in the electrode 22 by a removing processing by a mechanical processing, a compression molding by a pressing, or a chemical removing processing by an etching, for example.

Figure 9C:
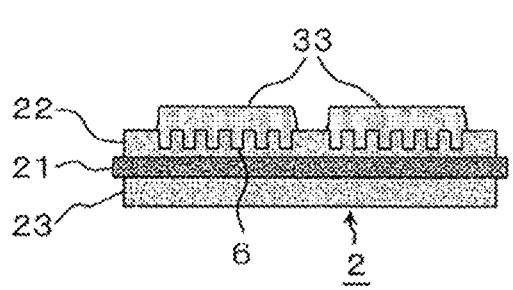

As illustrated in FIG. 9C, a sinter bonding material 33 containing the metal nanoparticles such as Ag is supplied to the joint region on the electrode 22 of the circuit substrate 2 (refer to FIG. 2) to join the circuit substrate 2 in which the concave-shaped part 6 is formed in the manner described above to the first and second semiconductor elements 4 and 5. The sinter bonding material 33 may be supplied by printing the sinter bonding material 33 having the paste form or by locating the sinter bonding material 33 having a sheet shape. When the sinter bonding material 33 has the paste form, it may also be printed on and supplied to the rear surface electrode in the rear side surface of the first and second semiconductor elements 4 and 5.

Figure 9D:
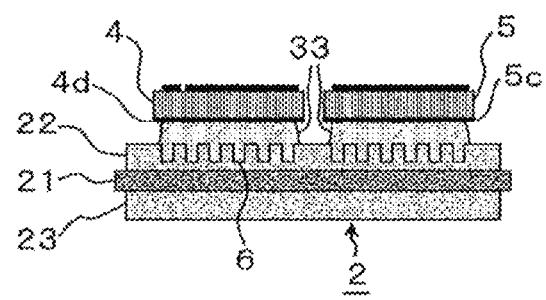

Subsequently, as illustrated in FIG. 9D, the first and second semiconductor elements 4 and 5 are disposed on the joint region in the electrode 22 of the circuit substrate 2. As described above, the sinter bonding material 33 is supplied on the electrode 22 of the circuit substrate 2 or the rear surface electrode of the first and second semiconductor elements 4 and 5, thus the sinter bonding material 33 has a configuration of being sandwiched between the first and second semiconductor elements 4 and 5 and the circuit substrate 2.

Figure 9E:
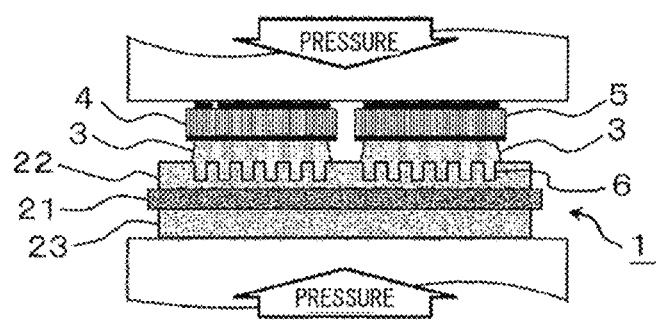

Subsequently, as illustrated in FIG. 9E, the sinter bonding material 33 sandwiched between the first and second semiconductor elements 4 and 5 and the circuit substrate 2 is heated at a temperature of 260 to 350° C. while applying the pressure of 20 to 30 MPa. As a result, the metal nanoparticles in the sinter bonding material 33 are sinter bonded, the joint layer 3 which is the sintered body is formed, and the electrode 22 of the circuit substrate 2 and the first and second semiconductor elements 4 and 5 are joined to each other, thus the semiconductor device 2 can be manufactured.

Figure 10A:
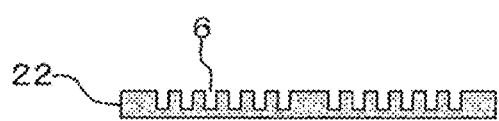
FIGS. 10A to 10E are drawings illustrating another method of manufacturing the semiconductor device according to the embodiment 1 of the present invention.
Figure 10B:
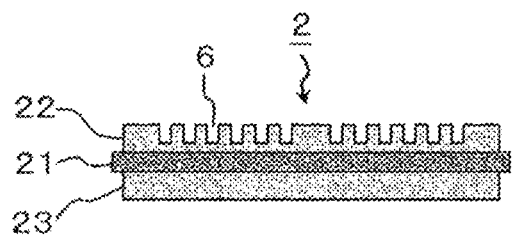
Figure 10C:
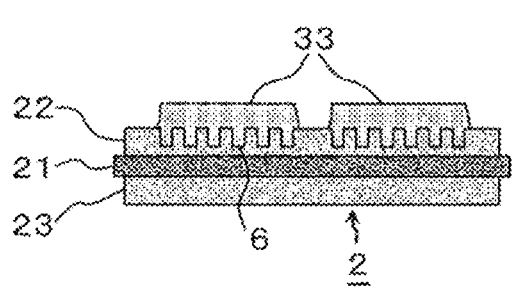
Figure 10D:
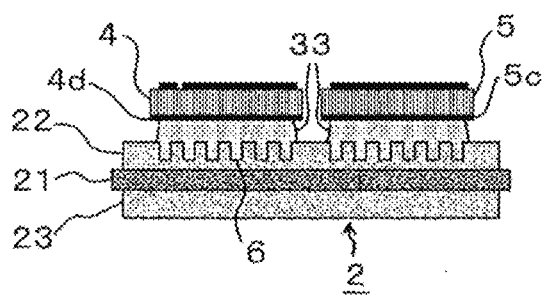
Figure 10E:
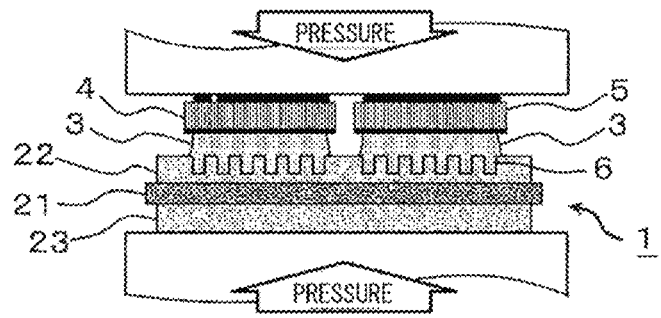

FIGS. 10A to 10E are drawings illustrating another method of manufacturing the semiconductor device according to the embodiment 1 of the present invention. The method of manufacturing the semiconductor device illustrated in FIGS. 10A to 10E differ from the method of manufacturing the semiconductor device illustrated in FIGS. 9A to 9E in method of manufacturing the circuit substrate 2, and they have the same subsequent steps. That is to say, the steps illustrated in FIGS. 10C to 10E are the same as the steps illustrated in FIGS. 9C to 9E described above, thus the detailed description is omitted herein.

In the method of manufacturing the semiconductor device illustrated in FIGS. 10A to 10E, the concave-shaped part 6 is formed in the electrode 22 in advance, and the electrode 22 is subsequently joined to the insulating plate 21 to manufacture the circuit substrate 2. As illustrated in FIG. 10A, the concave-shaped part 6 is formed in the electrode 22 by a removing processing by a mechanical processing, a compression molding by a pressing, or a chemical removing processing by an etching, for example. Subsequently, as illustrated in FIG. 10B, the electrode 22 in which the concave-shaped part 6 is formed is joined to one surface of the insulating plate 21 formed of a silicon nitride ceramic plate, for example, and the electrode 23 in which the concave-shaped part 6 is not formed is joined to the other surface. The electrodes 22 and 23 are joined to the insulating plate 21 by a brazing or casting, and are annealed by the heat applied at this time. That is to say, the electrodes 22 and 23 are annealed and joined to the insulating plate 21. According to the above steps, the circuit substrate 2 having the concave-shaped part 6 formed in the electrode 22 is manufactured as illustrated in FIG. 10B. Subsequently, the steps in FIGS. 10C to 10E, which are the same as the steps in FIGS. 9C to 9E described above, are performed, thus the semiconductor device 1 can be manufactured.

Since the concave-shaped part 6 is formed in the electrode 22 in advance as described above, the electrode 22 can be separately processed, and a cycle time required for performing the steps can be reduced by collectively processing the plurality of electrodes 22, for example. As a result, obtained is the effect that the manufacturing cost of the semiconductor device 1 can be reduced.

Embodiment 2

Figure 11:
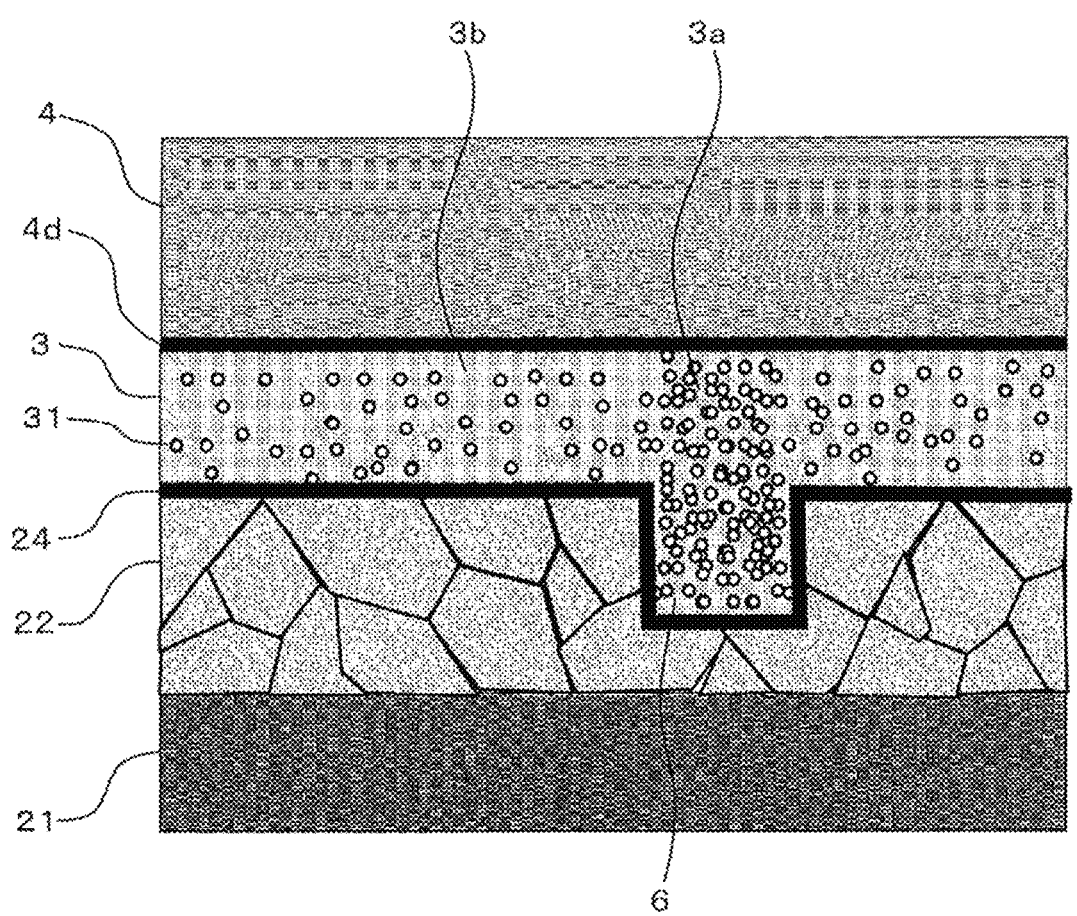
FIG. 11 is a cross sectional view schematically illustrating a structure near a joint layer of a semiconductor device according to an embodiment 2 of the present invention.

FIG. 11 is a cross sectional view schematically illustrating a structure near a joint layer of a semiconductor device according to the embodiment 2 of the present invention. In FIG. 11, the same reference numerals as those described in FIG. 5 in the embodiment 1 will be assigned to the same or corresponding constituent element and the description thereof will be omitted. The embodiment 2 of the present invention differs from the embodiment 1 in that a metalized layer 24 is provided in the surface of the electrode 22 of the circuit substrate 2, and a favorable junction using the sinter bonding material containing the metal nanoparticles is achieved regardless of the material of the electrode 22.

The metalized layer 24 is formed by, after forming the concave-shaped part 6 in the electrode 22 of the circuit substrate 2, laminating a metal material different from that of the electrode 22 on the surface of the electrode 22 by a method such as a plating, an evaporation coating, and a sputtering, for example. Since the metalized layer 24 only needs to be thinly formed on the surface of the electrode 22 to be joined to the joint layer 3, the metalized layer may have a thickness of approximately 10 nm to 10 μm. The metalized layer 24 enhances a favorable junction with the joint layer 3 formed of the sinter bonding material containing the metal nanoparticles, and the metalized layer 24 is formed of a single metal selected from Au, Pt, Pd, Ag, or Cu or a metal material made of an alloy including one of these metals.

The metalized layer 24 is provided on the surface of the electrode 22 in the manner described above, thus the material of the electrode 22 can be selected without considering the joint performance with the joint layer 3 formed of the sinter bonding material containing the metal nanoparticles. That is to say, the material of the electrode 22 only needs to have the excellent conductivity, and Cu, Aluminum (Al), or an alloy containing these materials as a main constituent may be applied to the material, for example, thus a freedom degree of selecting the material of the electrode 22 is increased. Although Al is particularly appropriate to the material of the electrode 22 because it has an excellent workability, it does not have the favorable joint performance with the joint layer 3 formed of the sinter bonding material, thus the electrode 22 having the excellent workability and joint performance can be obtained by providing the metalized layer 24 on the surface of the electrode 22 formed of Al.

The metalized layer 24 having the smaller hardness than the joint layer 3 can be used. Accordingly, even when the electrode 22 of the circuit substrate 2 is deformed to have the undulating shape in using it in the high temperature environment, the metalized layer 24 can follow the deformation of the electrode 22, thus the peeling of the metalized layer 24 from the electrode 22 can be suppressed, and the favorable joint reliability can be obtained in the manner similar to the semiconductor device described in the embodiment 1.

As described above, the embodiment 2 of the present invention has the effect that the material of the electrode 22 of the circuit substrate 2 can be selected regardless of the compatibility of joint performance with the joint layer 3 formed of the sinter bonding material containing the metal nanoparticles, and the favorable joint reliability with the joint layer 3 can be secured by the metalized layer 24, thus the semiconductor device having the excellent joint reliability even in the hot temperature environment can be obtained.

Embodiment 3

FIGS. 12A to 12D are top views and side cross sectional views illustrating a circuit substrate of a semiconductor device according to the embodiment 3 of the present invention. In FIGS. 12A to 12D, the same reference numerals as those described in FIG. 2 in the embodiment 1 will be assigned to the same or corresponding constituent element and the description thereof will be omitted. The embodiment 3 differs from the embodiment 1 of the present invention in forming pattern of the concave-shaped part 6 formed in the electrode 22.

Figure 12A:
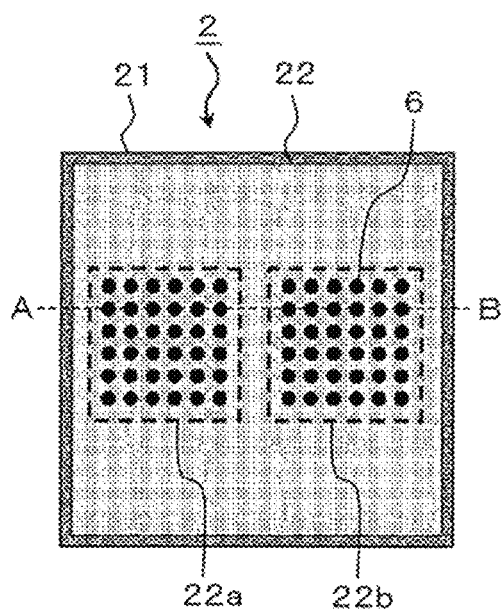
FIGS. 12A to 12D are top views and side cross sectional views illustrating a circuit substrate of a semiconductor device according to an embodiment 3 of the present invention.
Figure 12C:
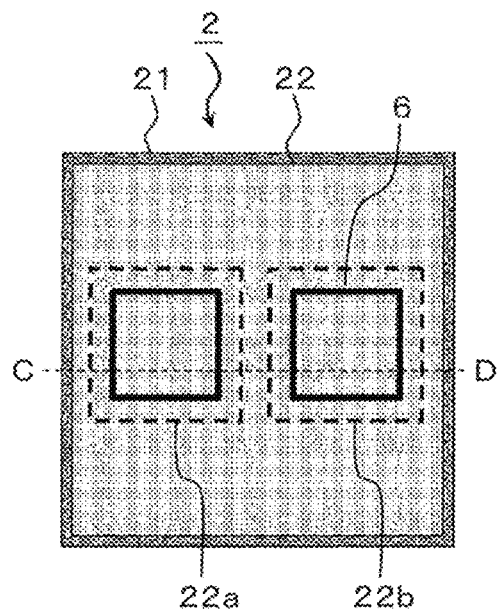
Figure 12B:
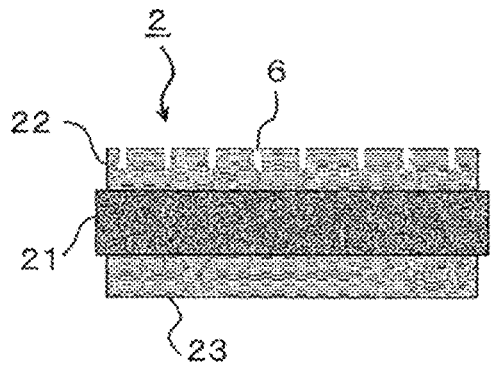

FIG. 12A is a top view of the circuit substrate 2 in which the concave-shaped part 6 is formed to be scattered about the entire region in the joint regions 22a and 22b in a state where the electrode 22 is viewed from the upper surface, and FIG. 12B is a cross sectional view of the circuit substrate 2 along a broken line A-B in FIG. 12A. In FIG. 2 in the embodiment 1, the concave-shaped part 6 is formed to have the lattice-like groove shape in the joint regions 22a and 22b in the state where the electrode 22 is viewed from the upper surface, however, the forming pattern of the concave-shaped part 6 is not limited thereto, but the concave-shaped part 6 may be formed to have the hole-like shape scattered about the entire region in the joint regions 22a and 22b when viewed from the upper surface as FIG. 12A.

Figure 12D:
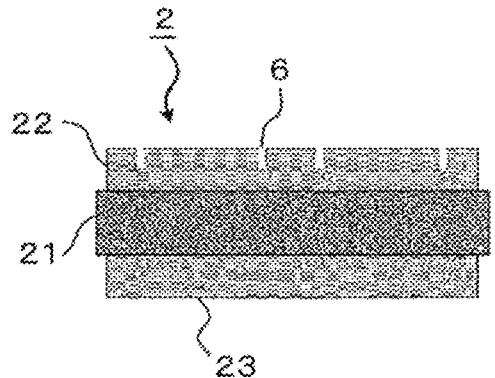

Moreover, the concave-shaped part 6 needs not necessarily be evenly provided in the entire region in the joint regions 22a and 22b in the electrode 22, but may be provided in a region having little influence even in a state where the crack is caused to occur in the joint layer by design. FIG. 12C is a top view of the circuit substrate 2 in which the concave-shaped part 6 is formed only in an outer peripheral part of the joint regions 22a and 22b in the electrode 22, and FIG. 12D is a cross sectional view of the circuit substrate 2 along a broken line C-D in FIG. 12C.

A function of radiating the heat of the first semiconductor element 4 and second semiconductor element 5 to the circuit substrate 2 is required for the joint layer 3, and a heat generating part in the first semiconductor element 4 and the second semiconductor element 5 is located in a central part of the semiconductor element in many cases. Accordingly, the configuration of the embodiment 3 has the effect that the area where the crack is caused to occur by design in the joint layer 3 is provided in an area except for the heat generating part such as the central part of the semiconductor element, thus the semiconductor device 1 having the favorable joint reliability can be obtained without interfering the function as a heat radiation path required for the joint layer 3.

The forming pattern of the concave-shaped part 6 is not limited to those illustrated in the embodiment 1 and the present embodiment 3, however, the forming patterns illustrated in those embodiments may be combined with each other. For example, also applicable is a forming pattern that the concave-shaped part 6 is scattered about the outer peripheral part of the joint regions 22a and 22b as FIG. 12A and has the lattice pattern in the central part of the joint regions 22a and 22b as illustrated in FIG. 2 in the embodiment 1. Another forming pattern which is not described in each embodiment of the present invention is also applicable as long as it causes the crack to occur selectively in the first region 3a being in contact with the concave-shaped part 6 in the joint layer 3 and does not cause the crack to occur in the second region 3b which is not in contact with the concave-shaped part 6 to obtain the favorable joint reliability.

At this time, when the forming pattern of the concave-shaped part 6 has a symmetrical shape of line symmetry or point symmetry, the unevenness of the crack occurring in the first region 3a in the joint layer 3 can be suppressed. In the line-symmetric forming pattern, when the first region 3a is folded along a certain straight line, the forming patterns in the both sides overlap with each other, and the certain straight line herein may be a straight line passing through a center of the joint regions 22a and 22b. In the point-symmetric forming pattern, when the first region 3a is rotated 180 degrees around a certain point, the forming pattern coincides with the initial forming pattern before being rotated, and the certain point herein may be a center of the joint regions 22a and 22b.

The crack occurs in the first region 3a in the joint layer 3 and the first region 3a has the filling rate of the metal crystal grain smaller than the second region 3b, thus the first region 3a has an electrical conductivity and thermal conductivity smaller than the second region 3a in the joint layer 3. Accordingly, too large a ratio of a total area of the first region 3a to an area of the joint region 22a or 22b in the electrode 22 causes an increase in electrical resistance or thermal resistance in the joint layer 3, thereby causing an inconvenience in some cases. Accordingly the ratio of the total area of the concave-shaped part 6 in each joint region to the area of the joint region 22a or 22b in the electrode 22 is preferably 1 to 50%, and more preferably 1 to 20%.

The reduction in electrical conductivity and thermal conductivity is determined in linear functional form by the ratio of the total area of the concave-shaped part 6 to the area of the joint region, however, in the case where the joint layer 3 is thin, there is little influence of the reduction in electrical conductivity and thermal conductivity compared with the case where the joint layer 3 is thick. In the case where the thickness of the joint layer 3 is approximately 100 μm, the ratio of the total area of the concave-shaped part 6 is preferably 1 to 20%, however, in the case where the thickness of the joint layer 3 is approximately 25 μm, the electrical conductivity and the thermal conductivity can be suppressed to a level equal to the case where the thickness of the joint layer 3 is approximately 100 μm, even when the ratio of the total area of the concave-shaped part 6 is 1 to 80%. However, when the ratio of the total area of the concave-shaped part 6 is larger than 50%, the strength of the joint layer 3 decreases and the semiconductor element is easily peeled from the electrode 22 of the circuit substrate, thus the ratio of the total area of the concave-shaped part 6 is preferably 50% or smaller.

Moreover, even when the ratio of the total area of the concave-shaped part 6 to the area of the joint region in the electrode 22 is 1%, the crack can be caused to occur right above the concave-shaped part 6 of the joint layer 3 and the stress can be reduced as described in the embodiment 1, the effect of enhancing the joint reliability can be obtained. When the ratio of the total area of the concave-shaped part 6 is small such as 1%, the reduction in electrical conductivity and thermal conductivity cause little problem, thus the ratio of the total area of the concave-shaped part 6 to the area of the joint region in the electrode 22 needs to be at least 1% regardless of the thickness of the joint layer 3.

Embodiment 4

FIG. 13 is a cross sectional view schematically illustrating a structure near a joint layer of a semiconductor device according to the embodiment 4 of the present invention. In FIG. 13, the same reference numerals as those described in FIG. 5 in the embodiment 1 will be assigned to the same or corresponding constituent element and the description thereof will be omitted. The concave-shaped part 6 is provided in the electrode 22 in the embodiment 1 of the present invention, however, the embodiment 4 differs from the embodiment 1 in that a convex-shaped part 7 is provided in the electrode 22.

The convex-shaped part 7 can be formed by removing a region in the electrode 22 other than the convex-shaped part 7 by a mechanical processing or an etching processing, for example. A shape of the convex-shaped part 7 may be a trapezoidal shape as illustrated in FIG. 11, a rectangular shape, or a hemispherical shape, or may also be a shape such as circular cone or pyramid. A convex-shaped part 7 may be linearly disposed to have a lattice forming pattern in the manner similar to those described in the embodiment 1 and the embodiment 3, or may also be distributed in dot form in the entire region in the joint region. That is to say, the forming pattern of the convex-shaped part 7 is not limited to a specific forming pattern as described in the embodiment 3.

When the convex-shaped part 7 is provided in the electrode 22, the region between the convex-shaped part 7 of the joint layer 3 and the rear surface electrode 4d of the semiconductor element 4 serves as the first region 3a and the other region serves as the second region 3b. When the convex-shaped part 7 is provided in the electrode 22, the first region 3a has the film thickness smaller than the second region 3b, and the first region 3a has the filling rate of the metal crystal grain larger than the second region 3b. Even in such a case, the filling rate of the metal crystal grain in the second region 3b is preferably equal to or larger than 80% and smaller than 100%. The film thickness of the first region 3a may also be defined by a distance between a top part of the convex-shaped part 7, that is to say, a part which has the smallest distance with the rear surface electrode 4d of the semiconductor element 4 and the rear surface electrode 4d.

As illustrated in the embodiment 4, when the convex-shaped part 7 is formed in the electrode 22, the thermal stress occurring in the joint layer 3 is concentrated in the convex-shaped part 7 at the time using the semiconductor device in the high temperature environment, and the stress locally increases in the first region 3a being in contact with the convex-shaped part 7 of the joint layer 3, thus the occurrence of the crack can be induced in the first region 3a or an interface between the first region 3a and the second region 3b by design. Accordingly, the occurrence of the crack in the second region 3b which is not in contact with the convex-shaped part 7 of the joint layer 3 can be suppressed, and the joint reliability of the joint layer 3 can be enhanced.

The semiconductor device in which the convex-shaped part 7 is formed in the electrode 22 described in the present embodiment 4 can also be manufactured by the manufacturing method described in the embodiment 1. That is to say, the convex-shaped part 7 may be formed by removing the area in the electrode 22 other than the convex-shaped part 7 by a removing processing by a mechanical processing or a removing processing such as a chemical removing processing by an etching, for example, in the manner similar to the case of forming the concave-shaped part 6 in the electrode 22 described in the description of FIG. 9B and FIG. 10A. The other steps are as described in the embodiment 1.

As described above, according to the embodiment 4 of the present invention, the convex-shaped part 7 is formed in the predetermined pattern in the electrode 22 to cause the crack to occur in the first region 3a being in contact with the convex-shaped part 7 of the joint layer 3, and the occurrence of the crack in the second region 3b which is not in contact with the convex-shaped part 7 can be suppressed, thus the effect similar to that described in the embodiment 1 can be obtained, and the semiconductor device having the favorable joint reliability can be obtained. As described above, the concave-shaped part may be provided in the electrode 22 as described in the embodiment 1, or the convex-shaped part may also be provided as described in the embodiment 4. Not only one of the concave-shaped part and the convex-shaped part but also both the concave-shaped part and the convex-shaped part may be provided in mixture in the electrode 22.

The present invention has been specifically described based on the embodiments, however, the present invention is not limited to each embodiment described above, but may be variously changed without departing from the spirit of the present invention. Moreover, the semiconductor device described in each embodiment described above and the manufacturing method thereof may be combined with each other.

EXPLANATION OF REFERENCE SIGNS

1 Semiconductor device
2 Circuit substrate
21 Insulating plate
22 Electrode
22a, 22b Joint region
3 Joint layer
3a First region, 3b second region
33 Sinter bonding material
4 First semiconductor element
5 Second semiconductor element
6 Concave-shaped part
7 Convex-shaped part

The invention claimed is:

1. A semiconductor device, comprising:
    an insulating plate;
    an electrode being provided on said insulating plate and having a concave part;
    a joint layer being made of a sintered body of metal crystal grains provided on said electrode; and
    a semiconductor element being joined to said electrode with said joint layer therebetween, wherein
    said concave part does not reach an end part of a joint surface between said electrode and said joint layer.

2. The semiconductor device according to claim 1, wherein
    said concave part is a portion formed in a surface of said electrode.

3. The semiconductor device according to claim 1, wherein
    a pattern of said concave part is symmetrical with respect to a center of said semiconductor element in planar view.

4. The semiconductor device according to claim 1, wherein
    a total area of said concave part is 1% to 20% of a total area of said joint layer in planar view.

5. The semiconductor device according to claim 1, wherein
    an average grain size of said metal crystal grain is equal to or larger than 10 nm and equal to or smaller than 150 nm.

6. The semiconductor device according to claim 1, wherein
    a material of said metal crystal grain is Ag.

7. The semiconductor device according to claim 1, wherein
    a material of said electrode is Cu or Al.

8. The semiconductor device according to claim 1, wherein
    a metal layer made of a metal material different from a metal material of said electrode is provided between said electrode and said joint layer.

9. The semiconductor device according to claim 8, wherein
    a material of said metal layer is a metal of one of Au, Pt, Pd, Ag, and Cu or an alloy containing one of Au, Pt, Pd, Ag, and Cu.

10. The semiconductor device according to claim 1, wherein
    said semiconductor element is formed of a wide band gap semiconductor material having a band gap larger than silicon.

11. The semiconductor device according to claim 10, wherein
    said wide band gap semiconductor material is one of silicon carbide, gallium nitride, gallium arsenic, and diamond.

12. A method of manufacturing a semiconductor device, comprising:
    providing a semiconductor element on an electrode being joined to an insulating plate with a sinter bonding material containing metal nanoparticles therebetween; and
    joining said electrode and said semiconductor element by heating said insulating plate and said semiconductor element while applying pressure, sinter bonding said sinter bonding material, and forming a joint layer in contact with said electrode, wherein
    said electrode is annealed to be joined to said insulating plate,
    said electrode has a concave part, and
    said concave part does not reach an end part of a joint surface between said electrode and said joint layer.

* * * * *